(12) United States Patent
Maguire et al.

(10) Patent No.: US 6,989,994 B2
(45) Date of Patent: Jan. 24, 2006

(54) CIRCUIT BOARD SUB-ASSEMBLIES, METHODS FOR MANUFACTURING SAME, ELECTRONIC SIGNAL FILTERS INCLUDING SAME, AND METHODS, FOR MANUFACTURING ELECTRONIC SIGNAL FILTERS INCLUDING SAME

(75) Inventors: Joseph N. Maguire, Syracuse, NY (US); Joseph A. Zennamo, Jr., Skaneateles, NY (US)

(73) Assignee: Eagle Comtronics, Inc., Clay, NY (US)

( * ) Notice: Subject to any disclaimer, the term of this patent is extended or adjusted under 35 U.S.C. 154(b) by 48 days.

(21) Appl. No.: 10/788,133

(22) Filed: Feb. 26, 2004

(65) Prior Publication Data
US 2005/0190543 A1   Sep. 1, 2005

(51) Int. Cl.
*H05K 9/00* (2006.01)
*H05K 7/02* (2006.01)
*H05K 7/04* (2006.01)

(52) U.S. Cl. .................... 361/753; 361/799; 361/800; 361/816; 361/818; 29/830; 174/35 R; 174/35 GC

(58) Field of Classification Search ............... 361/753, 361/799, 800, 816, 818, 752, 728, 730, 796, 361/748, 760, 795, 788; 174/35 R, 35 GC, 174/35 MS, 32, 250, 261, 262, 266; 307/91; 331/67; 334/85; 343/841, 846; 29/830, 29/831, 834–838; 439/328, 357
See application file for complete search history.

(56) References Cited

U.S. PATENT DOCUMENTS

| | | | | |
|---|---|---|---|---|
| 4,544,577 A | * | 10/1985 | May | 427/555 |
| 5,341,115 A | * | 8/1994 | Frei et al. | 333/246 |
| 5,537,123 A | * | 7/1996 | Mandai et al. | 343/700 MS |
| 5,561,265 A | * | 10/1996 | Livshits et al. | 174/35 GC |
| 5,880,937 A | * | 3/1999 | Schadhauser et al. | 361/794 |
| 5,969,680 A | * | 10/1999 | Tsuru et al. | 343/700 MS |
| 6,350,951 B1 | * | 2/2002 | Askew | 174/52.2 |
| 6,594,151 B2 | * | 7/2003 | Dixon et al. | 361/753 |
| 6,759,927 B2 | * | 7/2004 | Maguire et al. | 333/185 |

* cited by examiner

*Primary Examiner*—Kamand Cuneo
*Assistant Examiner*—Dameon E. Levi
(74) *Attorney, Agent, or Firm*—Burr & Brown

(57) ABSTRACT

An electronic signal filter includes a cylindrical housing and a circuit board positioned therein having a plurality of peripheral edges and at least two circular through-holes formed therein. Each through-hole is inwardly spaced from one of the peripheral edges of the circuit board, defining a first distance between a respective one of the through-holes and a respective peripheral edge of the circuit board and defining a second distance between the through-holes. The filter also includes a ground strap attached to and spaced a distance above the circuit board. The ground strap includes a first portion, an integral second portion residing in and extending through each through-hole, and an integral third portion that contacts a portion of the second surface of the circuit board. At least a portion of the first portion of the ground strap contacts the inner peripheral surface of the cylindrical housing to ground the circuit board.

28 Claims, 8 Drawing Sheets

US 6,989,994 B2

CIRCUIT BOARD SUB-ASSEMBLIES, METHODS FOR MANUFACTURING SAME, ELECTRONIC SIGNAL FILTERS INCLUDING SAME, AND METHODS, FOR MANUFACTURING ELECTRONIC SIGNAL FILTERS INCLUDING SAME

FIELD OF THE INVENTION

The present invention relates to a circuit board sub-assembly including a ground strap for grounding an electronic component. In particular, the present invention relates to a circuit-board sub-assembly including a ground strap that provides a ground connection between the circuit board and filter housing of an electronic signal filter.

BACKGROUND OF THE INVENTION

For electronic signal filter applications that require magnetic isolation shielding between different filter sections, isolation shields are typically soldered to the circuit board. After the circuit board sub-assembly is inserted into an electronic signal filter housing (which is typically grounded), the isolation shields are soldered to the housing to provide a ground connection between the circuit board and the filter housing. There are some electronic signal filter applications, however, that do not require magnetic isolation shielding, and thus, do not include isolation shields that can also be used to provide the required ground connection.

In electronic signal filter applications where magnetic isolation is not required, ground straps have instead been used to provide the required ground connection between the circuit board and the filter housing. One example of such a ground strap is shown in FIG. 1.

The circuit board sub-assembly 130 shown in FIG. 1 includes a ground strap 10 and a notched circuit board 100. The ground strap 10 is an arched structure including a flattened upper portion 15 interposed between arch portions 14*a* and 14*b*. As shown, the upper portion 15 of the ground strap 10 is substantially parallel to the plane of the circuit board 100, that is, parallel to both the upper surface 101 and the lower surface 102 of the circuit board 100. The arched portions 14*a*, 14*b* respectively include a shoulder portion 13*a*, 13*b* proximate the respective terminal ends thereof. The shoulder portions 13*a*, 13*b* extend inwardly as shown in FIG. 1 in a direction that is substantially parallel to the plane of the circuit board 100. A pair of support arms 13*c*, 13*d* extend from a respective shoulder portion 13*a*, 13*b* in a direction that is also substantially parallel to the plane of the circuit board 100, such that the support arms 13*c*, 13*d* are substantially inwardly extending extensions of the respective shoulder portions 13*a*, 13*b*.

Proximate the shoulder portions 13*a*, 13*b*, the terminal end portions of the ground strap 10 are again bent to form a pair of leg portions 12*a*, 12*b* that extend from a respective shoulder portion 13*a*, 13*b* in a direction (e.g., downward) that is substantially perpendicular to the plane of the circuit board 100. The leg portions 12*a*, 12*b* are also bent to form a respective foot portion 11*a*, 11*b* that extends in a direction that is substantially perpendicular to the direction of the leg portions 12*a*, 12*b* (e.g., inwardly as shown in FIG. 1) and that is also substantially parallel to the plane of the circuit board 100.

As shown in FIG. 2, the circuit board 100 of FIG. 1 is merely one of a plurality of interconnected circuit boards 100 that are formed in a sheet of circuit board material such that the circuit boards 100, 100' are attached via retention tabs 121*a*, 121*b* (121*a'*, 121*b'*) to form an array 120. As shown in FIGS. 1 and 2, each circuit board 100 includes an upper surface 101, a lower surface 102, a first lateral side 103, an opposed second lateral side 104, a first end 105 and an opposed second end 106. As shown in FIG. 2, while the circuit boards 100 remain in the array 120 via the retention tabs 121*a*, 121*b*, the first end 105 and the second lateral side 104 are defined by singulation channel 122, and the second end 106 and the first lateral side 103 are defined by singulation channel 123. Singulation channel 122 is separated from singulation channel 123 by retention tab 121*a* proximate the intersection point of the first lateral side 103 and the first end 105 of the circuit board 100, and by retention tab 121*b* proximate the intersection point between the second lateral side 104 and the second end 106 of the circuit board 100.

In the array 120, as shown in FIG. 2, a circuit board 100' is located immediately adjacent each circuit board 100, sharing a common singulation channel. For example, in FIG. 2, circuit board 100' includes a first lateral side 103', an opposed second lateral side 104', a first end 105' and an opposed second end 106'. While the circuit boards 100' remain in the array 120 via the retention tabs 121*a'*, 121*b'*, the first end 105' and the second lateral side 104' are defined by singulation channel 124, and the second end 106' and the first lateral side 103' are defined by the common singulation channel 122 that is shared with the adjacent circuit board 100 as shown. Singulation channel 122 is separated from singulation channel 124 by retention tab 121*a'* proximate the intersection point of the first lateral side 103' and the first end 105' of the circuit board 100', and by retention tab 121*b'* proximate the intersection point between the second lateral side 104' and the second end 106' of the circuit board 100'.

A pair of notches 110, 110 are provided in the first and second lateral sides 103, 104 of the circuit board 100. The notches 110 are each defined by a pair of parallel notch sides 111 that extend inwardly from the peripheral edges of the first and second lateral sides 103, 104 toward a respective terminal end in a direction that is perpendicular to the first and second lateral sides 103, 104 and by a notch base 112 that extends between the respective terminal ends of the notch sides 111 in a direction that is parallel to the first and second lateral sides 103, 104. The parallel notch sides 111 have a length that is approximately 0.030", and each notch base 112 has a length that is slightly longer than the width of the foot portions 11*a*, 11*b* of the ground strap 110. The notch bases 112 and parallel notch sides 111 of each circuit board 100 are plated with a conductive plating material.

A plurality of the ground straps 10 of FIG. 1 are attached to the circuit boards 100 of the array 120 in the manner shown in FIG. 3. That is, a first ground strap 10 is attached to a first circuit board 100 of the array 120 by positioning the foot portion 11*a* proximate the lower surface 102 of the circuit board 100 in the vicinity of the notch 110 on the first lateral side 103 of the circuit board 100. The ground strap 10 is positioned and moved laterally (i.e., Y-axis assembly movement) and slightly vertically (i.e., Z-axis assembly movement) toward the first lateral side 103 of the circuit board such that the support arm 13*c* is positioned on the upper surface 101 of the circuit board 100 and the upper surface of the foot 11*a* is positioned on the lower surface 102 of the circuit board 100. The Y-axis lateral positioning continues until the leg portion 12*a* is substantially flush against the notch base 112. The ground strap 10 is then essentially stretched up and over the circuit board 100, in both the Y and Z-axis directions, until the upper surface of the other foot portion 11*b* is positioned under the lower surface 102 of the circuit board 100. The ground strap 10 is then resiliently snapped into position such that the upper surface of the foot portions 11a, 11b contact the lower surface 102 of the circuit board 100, the support arms 13c, 13d contact the upper surface 101 of the circuit board 100, and the leg portion 12b is substantially flush against the notch base 112 on the second lateral side 104 of the circuit board 100. A bottom view of the assembled circuit board sub-assembly 130, including the circuit board 100 with the ground strap 10 attached thereto is shown in FIG. 4.

Subsequent ground straps 10 are then attached to adjacent circuit boards 100 of the array 120 in a similar manner. After the ground straps 10 are properly assembled onto the array 120 and the array 120 is wave soldered, the individual circuit boards sub-assemblies 130 themselves (which also include a plurality of discrete electronic components that are not shown) are singulated from the array 120 by severing the retention tabs 121a, 121b. The individual circuit board sub-assemblies 130 are then inserted into various electronic equipment, such as CATV filter housings, and a ground connection between the circuit board 100 and the filter housing is provided by soldering a portion of the ground strap 10 to the filter housing through a notch provided in the filter housing member.

There are, however, several drawbacks associated with using the circuit board sub-assembly 130 including the ground strap 10 and the notched circuit board 100 shown in FIGS. 1–5.

First, it is difficult to provide the required conductive plating material on the notch sides 111 and the notch base 112 defining the notches 110 in the thickness direction of the circuit board 100 since the notches 110 are typically punch formed. That is, the punch formed surfaces of the notches 110 are not smooth, as compared to drilled or routed surfaces, and that roughened surface structure, in combination with the position on the peripheral edges of the lateral sides of the circuit boards 100, are not conducive to efficient and effective plating.

Second, due to the fact that the circuit boards 100 are closely positioned in the array 120, that is, spaced apart from one another by little more than the widths of the singulation channels 122 and 123 and possibly a small amount of circuit board material therebetween, there is only a minute clearance (on the order of 0.100") between the peripheral edges of adjacent circuit boards 100, as shown in FIG. 5. Further, since the shoulder portions 13a, 13b of the ground straps 10 extend laterally outwardly a distance beyond the peripheral edges of the first and second lateral sides 103, 104 of the circuit boards 100 toward other adjacent ground straps 10, the clearance between adjacent sub-assemblies 130 is further limited. This very close proximity presents difficulties when sequentially assembling subsequent ground straps 10 on the array 120, since each ground strap 10 must be stretched both upwardly (Z-axis) and outwardly (Y-axis) in order to be positioned in and retained by the notches 110 in the circuit boards 100. That is, the required multi-directional-axis assembly steps are more complicated and time consuming than single- axis assembly steps. Additionally, the close proximity of adjacent ground straps further complicates the process in that a high degree of precision is required to ensure proper assembly of each ground strap and to avoid causing damage to adjacent ground straps during the assembly process.

The structure of the circuit board sub-assembly 120 causes another problem in that solder wicking tends to be promoted between adjacent ground straps 10 when the array 120 is wave soldered. For example, referring to FIG. 5, solder from the bath tends to travel (wick) up the outer surfaces of the leg portions 12a, 12b of the ground strap 10, and the outer surfaces of the leg portions 12a', 12b', such that solder ends up being present between the bulbous portion of shoulder 13b of the ground strap 10 and the adjacent bulbous portion of shoulder 13a' of the ground strap 10'. In order to prevent such wicking, a plurality of plastic insulator members (not shown) are provided in the clearance between adjacent ground straps before the array 120 is wave soldered. Although the plastic insulator members effectively prevent the adjacent ground straps from being soldered together as a result of the aforementioned wicking, these plastic insulator members constitute additional parts and additional assembly steps must be performed to insert the insulation members before the array is wave soldered and after the array is wave soldered, prior to singulation, to remove the insulator members. In that manner, the costs, with respect to both time and parts, are increased.

The circuit board sub-assembly 230 shown in FIG. 6, including a ground strap 20 provided on a slotted circuit board 200, was developed to address the aforementioned drawbacks associated with the circuit board sub-assembly 130. As shown in FIG. 6, the ground strap 20 is an arched structure including a flattened upper portion 25 interposed between arched portions 24a and 24b. The upper portion 25 of the ground strap 20 is substantially parallel to the plane of the circuit board 200, that is, parallel to both the upper surface 201 and the lower surface 202 of the circuit board 200. The arched portions 24a, 24b respectively include a shoulder portion 23a, 23b proximate the respective terminal ends thereof. The shoulder portions 23a, 23b extend inwardly as shown in FIG. 6 in a direction that is substantially parallel to the plane of the surfaces 201, 202 of the circuit board 200.

Proximate the shoulder portions 23a, 23b, the strap 20 is again bent to form a pair of substantially perpendicular leg portions 22a, 22b that extend from a respective shoulder portion 23a, 23b in a direction (e.g., downward) that is substantially perpendicular to the plane of the surfaces 201, 202 of the circuit board 200. The leg portions 22a, 22b are also slightly bent to form a respective hook portion 21a, 21b that extends in an angled direction, e.g., outwardly as shown in FIG. 6, from the respective terminal ends of the ground strap 20.

Like the circuit board 100 shown in FIG. 2, the circuit board 200 of FIGS. 6–10 is merely one of a plurality of interconnected circuit boards 200 that are attached via retention tabs 221a, 221b in an array 220. Each circuit board 200 includes an upper surface 201, a lower surface 202, a first lateral side 203, an opposed second lateral side 204, a first end 205 and an opposed second end 206.

As shown in FIG. 7, while the circuit boards 100 remain in the array 220 via the retention tabs 221a, 221b, the first end 205 and the second lateral side 204 of the circuit board 200 are defined by singulation channel 222, and the second end 206 and the first lateral side 204 are defined by another singulation channel 223. Singulation channel 222 is separated from singulation channel 223 by retention tab 221a proximate the intersection point of the first lateral side 203 and the first end 205 of the circuit board 200, and by retention tab 221b proximate the intersection point between the second lateral side 204 and the second end 206 of the circuit board 200.

In the array 220, as shown in FIG. 7, a circuit board 200' is located immediately adjacent each circuit board 200, sharing a common singulation channel 222. For example, circuit board 200' includes a first lateral side 203', an opposed second lateral side 204', a first end 205' and an opposed second end 206'. While the circuit boards 200' remain in the array 220 via the retention tabs 221a', 221b', the first end 205' and the second lateral side 204' are defined by singulation channel 224, and the second end 206' and the first lateral side 203' are defined by the common singulation channel 222 that is shared with the adjacent circuit board 200 as shown. Singulation 222 is separated from singulation channel 224 by retention tab 221a' proximate the intersection point of the first lateral side 203' and the first end 205' of the circuit board 200', and by retention tab 221b' proximate the intersection point between the second lateral side 204' and the second end 206' of the circuit board 200'.

Unlike the circuit board 100 shown in FIG. 2, however, each circuit board 200, 200' of FIGS. 6–10 includes a pair of slots 210 (210') formed therein proximate a respective one of the first and second lateral sides 203, 204 thereof. Each slot 210 is essentially an elongated hole that includes a first rounded end 211, an opposed second rounded end 213, and a pair of parallel slot sides 212a, 212b extending therebetween. The slot sides 212a, 212b are spaced apart from each other by a distance of about 0.030", and the outer slot sides 212a, 212b are spaced a distance of about 0.030" from the peripheral edges of the first and second lateral sides 203, 204 of the circuit board 200.

A plurality of the ground straps 20 of FIG. 6 are attached to the circuit boards 200, 200' of the array 220 in the manner shown in FIG. 8. Using only Z-axis manufacturing techniques, the arched portions 24a, 24b of the ground strap 20 are compressed, for example, by a lateral pincer motion of a Z-axis type robotic arm, and the hook portions 21a, 21b are downwardly inserted into the slots 210 until the terminal ends of the hook portions 21a, 21b are positioned under the lower surface 202 of the circuit board 200. When the compressive force is robotically released, the arched portions 24a, 24b expand outwardly and the leg portions 22a, 22b contact the outer slot sides 212a within each slot 212. The hook portions 21a, 21b effectively engage the lower surface 202 of the circuit board 200 and extend a distance beyond the outer slot sides 212a toward the peripheral edges of a respective first or second lateral side 203, 204 of the circuit board 200.

As shown in FIGS. 6 and 9, for example, the outer slot sides 212a of the slots 210 are inwardly spaced a distance from the edges of the lateral sides 203, 204 of the circuit board 200 such that the shoulder portions 23a, 23b contact the upper surface 201 of the circuit board 200 between one of the outer slot sides 212a and a respective lateral side 203, 204 of the circuit board 200. The circuit board 200 is effectively sandwiched between the shoulder portions 23a, 23b and the hook portions 21a, 21b, and the leg portions 22a, 22b exert a force on the outer slot sides 212a to provide a degree of anti-rocking stability for each sub-assembly 230.

In that manner, the circuit board sub-assembly 230 including ground strap 20 in combination with the slotted circuit boards 200, 200' provides a degree of anti-rocking stability and substantially eliminates Y-axis insertion assembly steps, which offers a significant improvement over the ground strap 10 and notched circuit boards 100, 100' of FIGS. 1–5.

Further, as shown in FIG. 10, since the slots 210 are spaced inwardly from the peripheral edges of the lateral sides 203, 204 of the circuit board 200, a sufficient clearance is maintained between the shoulder portion 23b of ground strap 20 and the shoulder portion 23a' of ground strap 20' shown in FIG. 10. Further, since the leg portions 22a, 22b are located within (e.g., surrounded by) the slots 210, the outer surfaces of the leg portions 22a, 22b are not directly exposed to the solder in the bath and the aforementioned wicking phenomena, described above with respect to FIG. 5, does not occur. Accordingly, there is no need to provide and position additional plastic insulator pieces between adjacent ground straps 20 before wave soldering the array 220, which, in turn, reduces the amount of time and materials, and thus the costs, required to produce the circuit board sub-assemblies 230.

Moreover, since the slots 210 are inwardly spaced from the peripheral edges of the lateral sides 203, 204 of the circuit board 200, and since the slots 210 shown in FIG. 11 are formed in the sheet of circuit board material 2 by peck drilling a series of overlapping holes in positions corresponding to the proper location for each circuit board 200 of the array 220 (see also FIG. 7), the slots 210 can easily be plated. This eliminates the aforementioned plating difficulties experienced in connection with the notched circuit boards 100 and provides yet another time saving advancement over the previous ground strap 10 and circuit board sub-assembly 130.

Although the ground strap 20 essentially addresses and corrects the aforementioned problems associated with the ground strap 10, drawbacks remain when using the circuit board sub-assembly 230 including the ground strap 20 and the slotted circuit board 200. For example, due to the elongate structure of the slots 210 and their proximity to the peripheral edges of the lateral sides 223, 224 of the circuit board 200, the slots 210 tend to experience deformation when the singulation channels 222, 223 defining the periphery of the circuit boards 200 are punch formed.

That is, when the singulation channels 222, 223 are punched, some of the circuit board material 2 tends to encroach upon and deform the previously peck-drilled slots 210. More specifically, the outer slot sides 212a of the slots 210 can be warped inwardly or otherwise compressed such that the proper portions of the ground strap 20 will not fit therein as intended without first routing out the slot 210. This additional routing operation is yet another slot formation step that further increases production time and costs, and one that must be specifically directed to those slots 210 that actually experience deformation.

In an effort to address this slot deformation problem, the following solution was implemented. That is, after the pairs of slots 210 are formed in their proper locations on the circuit board material 2, as shown in FIG. 11, a second set of juxtaposed peck-drilled slots 215 are formed in positions corresponding to the intended locations of the singulation channels 222, 223, immediately adjacent the slots 210, as shown in FIG. 12. In that manner, since none of the circuit board material 2 is present in the location of the second set of peck drilled slots 215 when the circuit board material 2 is punched to form the singulation channels 222, 223, the aforementioned slot deformation is reduced.

Although targeted subsequent routing of the slots 210 is essentially avoided in this manner, forming the second set of peck drilled slots 215 prior to punch forming the singulation channels 222, 223 still requires an additional, precision manufacturing step that would be desirably avoided.

Additionally, the structure of the slotted circuit board 200 subjects the circuit board sub-assembly 230 to other stress defect/failure factors. That is, the shape of the slots 210 also presents drawbacks due to the proximity to the edges of the circuit board, the elongate configuration, and the manner in which the ground straps 20 apply pressure on the outer slot sides 212a thereof, as described above. Further, although the slots 210 assume less of the total surface area of the circuit board 200 than the notches 110, it would be even more desirable to provide a ground strap that could be assembled to a circuit board in a manner that requires even less circuit board surface area.

Thus, it would be desirable to provide a ground strap that overcomes all of the above drawbacks associated with prior art ground straps. It would be desirable to provide a ground strap that can be assembled to a circuit board while requiring only a minimal amount of circuit board surface area, a ground strap that provides a circuit board sub-assembly having improved strength and durability, and a ground strap that facilitates overall improved manufacturing efficiency.

SUMMARY OF THE INVENTION

It is an object of the present invention to overcome the drawbacks associated with the prior art ground straps mentioned above. That is, it is an object of the present invention to provide a ground strap that can be assembled to a circuit board while requiring only a minimal amount of circuit board surface, that provides a circuit board sub-assembly having improved strength, and which facilitates an overall manufacturing efficiency improvement.

According to one embodiment of the present invention, an electronic signal filter is provided, including a cylindrical housing adapted to be electrically grounded and having a first end, an opposed second end and an inner peripheral surface defining an interior compartment, and a circuit board positioned within the interior compartment of the cylindrical housing. The circuit board has a first surface and an opposed second surface and substantially divides the interior compartment into a first compartment defined by the first surface of the circuit board and a first portion of the inner peripheral surface of the cylindrical housing, and a second compartment defined by the second surface of the circuit board and a second portion of the inner peripheral surface of the cylindrical housing. The circuit board further has a plurality of peripheral edges and at least two circular through-holes formed therein. Each through-hole is inwardly spaced from one of the peripheral edges of the circuit board, defining a first distance between an outermost peripheral portion of a respective one of the through-holes and a respective peripheral edge of the circuit board and defining a second distance between the centers of the through-holes. The electronic signal filter also includes a ground strap attached to and spaced a distance above the circuit board. The ground strap has a first portion extending from the first surface of the circuit board and spanning a portion of the circuit board over at least the second distance, an integral second portion residing in and extending through each through-hole, and an integral third portion immediately adjacent the second portion. The third portion contacts a portion of the second surface of the circuit board. Preferably, the third portion of the ground strap contacts a portion of the second surface of the circuit board in a portion of the first distance. At least a portion of the first portion of the ground strap contacts a portion of the inner peripheral surface of the cylindrical housing to ground the circuit board.

Preferably, the through-holes are plated with a conductive material. The first distance is preferably about 0.030", and the second distance is preferably about 0.528". It is also preferred that the diameter of the through-hole is about 0.048".

According to one aspect of the present invention, the first portion of the ground strap comprises a pair of arcuate portions extending from the first surface of the circuit board in a first direction generally perpendicular to a plane of the first surface of the circuit board. The arcuate portions are joined by a flat portion extending between a respective first end of each arcuate portion in a second direction substantially parallel to the plane of the first surface of the circuit board. The first portion of the ground strap also includes a pair of shoulder portions extending from a respective first end thereof integral with a respective second end of each arcuate portion substantially in the second direction such that a portion of each shoulder portion contacts the first surface of the circuit board in a portion of the first distance.

The second portion of the ground strap also preferably includes a pair of leg portions extending from a first end thereof integral with a respective second end of each shoulder portion, and extending through the through-holes, in a third direction substantially perpendicular to the plane of the first surface of the circuit board and opposing the first direction. It is preferred that the width of each the leg portion is less than the width of at least one of the arcuate portion and the shoulder portion such that the leg portions fit within and contact at least a portion of an inner surface of the through-holes.

The third portion of the ground strap preferably includes a pair of foot pads extending from a first end that is integral with a respective second end of each leg portion to a respective terminal end thereof in the second direction toward a respective peripheral edge of the circuit board. A portion of each the foot portion contacts a portion of the second surface of the circuit board in a portion of the first distance.

According to another embodiment of the present invention, a method for manufacturing a circuit board sub-assembly is provided. The method includes the steps of providing a sheet of circuit board material having a first surface and an opposed second surface, forming a plurality of circular through-holes in the sheet, and forming a plurality of singulation channels in the sheet. The singulation channels define a plurality of retention tabs that separate the singulation channels from one another, and define a plurality of peripheral edges defining a plurality of circuit boards each having a first surface and an opposed second surface and including at least two of the through-holes. The through-holes are positioned proximate and spaced a distance from opposed peripheral edges of the circuit board and are spaced a second distance from one another. The method also includes the steps of providing a plurality of ground straps having a first portion, an integral second portion, and a third portion immediately adjacent the second portion and positioning the ground straps on the circuit boards of the array. The first portion extends a distance above the first surface of the circuit board and spans the circuit board over the second distance, the second portion extends into and resides within the through-holes, and the third portion contacts a portion of the second surface of the circuit board. The method further includes the steps of wave soldering the array to secure the ground straps to the circuit boards and singulating each circuit board from the array to provide an individual circuit board sub-assembly. The method preferably further includes a step of plating the through-holes before the singulation channels are formed.

According to another embodiment of the present invention, method for manufacturing a CATV filter is provided. The method includes the steps of providing a circuit board sub-assembly according to the steps of the method described above, and providing a cylindrical filter housing adapted to be electrically grounded and having a first end, an opposed second end, an outer surface, an inner peripheral surface defining an interior compartment and at least one opening communicating between the outer surface and the interior compartment. The circuit board-sub assembly is positioned within the interior compartment of the cylindrical housing such that the circuit board substantially divides the interior compartment into a first compartment defined by the first surface of the circuit board and a first portion of the inner peripheral surface of the cylindrical housing, and a second compartment defined by the second surface of the circuit board and a second portion of the inner peripheral surface of the cylindrical housing. The first portion of the ground strap is located within the first compartment, the at least one opening communicates between the outer surface of the filter housing and the first compartment, and a portion of the first portion of the ground strap is exposed to the outside environment via the opening. The method also includes the step of grounding the circuit board by applying a solder to the opening of the filter housing in intimate contact with a portion of the first portion of the ground strap and at least a portion of the inner peripheral surface of the cylindrical housing.

According to another embodiment of the present invention, a circuit board sub-assembly is provided, including a circuit board having a first surface, an opposed second surface, a plurality of peripheral edges and at least two circular through-holes formed therein. Each through-hole is inwardly spaced from one of the peripheral edges of the circuit board, defining a first distance between a respective one of the through-holes and a respective peripheral edge of the circuit board and defining a second distance between the through-holes. A ground strap is also attached to the circuit board. The ground strap has a first portion extending a distance above the first surface of the circuit board and spanning a portion of the circuit board over at least the second distance, an integral second portion residing in and extending through each the through-hole, and an integral third portion immediately adjacent the second portion. The third portion contacts a portion of the second surface of the circuit board, preferably in a portion of the first distance. Preferably, the through-holes are plated with a conductive material.

According to yet another embodiment of the present invention, a circuit board sub-assembly is provided. The circuit board sub-assembly includes a circuit board having a first surface, an opposed second surface, a plurality of peripheral edges and at least two circular through-holes formed therein. Each through-hole is inwardly spaced from one of the peripheral edges of the circuit board, defining a first distance between an outer peripheral portion of a respective one of the through-holes and a respective peripheral edge of the circuit board and defining a second distance between respective centers of the through-holes. The circuit board sub-assembly also includes a ground strap attached to the circuit board. The ground strap comprises a first portion extending a distance above the first surface of the circuit board and spanning a portion of the circuit board over at least the second distance. The first portion of the ground strap comprises a pair of arcuate portions extending above the first surface of the circuit board in a first direction away from the first surface of the circuit board. The arcuate portions are joined by a flat portion extending between a respective first end of each arcuate portion in a second direction substantially parallel to the plane of the first surface of the circuit board. The first portion of the ground strap further includes a pair of shoulder portions extending from a respective first end thereof integral with a respective second end of each arcuate portion substantially in the second direction such that a portion of each shoulder portion contacts the first surface of the circuit board in a portion of the first distance. The first portion of the ground strap also includes mechanical engagement means for providing solderless grounding contact positioned on a portion of each arcuate portion proximate a respective one of the shoulder portions. The ground strap also includes an integral second portion residing in and extending through each through-hole. The second portion of the ground strap comprises a pair of leg portions extending from a first end thereof integral with a respective second end of each shoulder portion, and extending through the through-holes in a third direction substantially perpendicular to the plane of the first surface of the circuit board and opposing the first direction. The ground strap further includes an integral third portion immediately adjacent the second portion. The third portion of the ground strap comprises a pair of foot pads extending from a first end thereof integral with a respective second end of each leg portion in the first direction toward a respective peripheral edge of the circuit board such that a portion of each foot portion contacts a portion of the second surface of the circuit board in a portion of the first distance. The third portion of the ground strap contacts a portion of the second surface of the circuit board.

Preferably, each mechanical engagement means for providing solderless grounding contact comprises a protrusion extending outwardly away from the arcuate portions. When the circuit board sub-assembly is inserted into a housing member, such as a CATV filter housing, the mechanical engagement means provides the required electrical contact between the filter housing member, the ground strap and the circuit board to ground the circuit board without soldering the ground strap to the housing member.

According to yet another aspect of the present invention, a method for manufacturing a CATV filter is provided. The method includes the steps of providing a circuit board sub-assembly by a method including the steps of providing a sheet of circuit board material having a first surface and an opposed second surface, forming a plurality of circular through-holes in the sheet, and forming a plurality of singulation channels in the sheet. The singulation channels define a plurality of retention tabs that separate the singulation channels from one another, and define a plurality of peripheral edges defining an array of circuit boards. Each circuit board has a first surface and an opposed second surface and includes at least two of the through-holes. The through-holes are positioned proximate and spaced a first distance from opposed peripheral edges of the circuit board and are spaced a second distance from one another. The method of providing a circuit board sub-assembly also includes the steps of providing a plurality of ground straps each having a first portion including mechanical engagement means for providing solderless grounding contact, an integral second portion, and a third portion immediately adjacent the second portion. The ground straps are positioned on the circuit boards of the array such that the first portion extends a distance above the first surface of the circuit board and spans the circuit board over the second distance, the second portion extends into and resides within the through-holes, and the third portion contacts a portion of the second surface of the circuit board. The array is wave soldered to respectively secure the ground straps to the circuit boards, and each circuit board is singulated from the array to provide an individual circuit board sub-assembly. The method for manufacturing a CATV filter also includes the step of providing a cylindrical filter housing adapted to be electrically grounded and having a first end, an opposed second end, an outer surface, and an inner peripheral surface defining an interior compartment. The circuit board-sub assembly is positioned within the interior compartment of the cylindrical housing such that the circuit board substantially divides the interior compartment into a first compartment defined by the first surface of the circuit board and a first portion of the inner peripheral surface of the cylindrical housing, and a second compartment defined by the second surface of the circuit board and a second portion of the inner peripheral surface of the cylindrical housing. The first portion of the ground strap is located within the first compartment, and the mechanical engagement means for providing solderless grounding contact engages a portion of the inner peripheral surface of the first compartment to provide secure grounding contact between the filter housing member and the circuit board without soldering.

The various embodiments of the present invention overcome the drawbacks associated with the prior art ground straps and circuit board sub-assemblies described above in a variety of ways. First, the shoulder portions and the foot pads of the ground strap according to the present invention essentially sandwich the circuit board of the present invention, and the leg portions of the ground strap of the present invention exert outward pressure on a portion of the surface of the through-holes to provide improved Y and Z-axis stability and improved anti-rocking features. Preventing the ground straps of the circuit board sub-assemblies from rocking on the circuit boards as the array is wave soldered is important, for example, because it is desirable for the axis of the ground strap to remain perpendicular to the circuit board during wave soldering, and subsequently, when the circuit board sub-assembly is inserted into a filter housing.

That is, any deviation from the desired positional relationship between the ground strap and the circuit board of a circuit board sub-assembly is likely to result in misalignment during insertion into a filter housing. Such misfits can disrupt or interfere with providing the proper clearance between the first portion of the ground strap and the inner surface of the filter housing for subsequent soldering that is sufficient to provide the intended electrical communication between the circuit board, the ground strap and the filter housing. Also, the structural integrity of the ground strap can be distorted or damaged if a misaligned sub-assembly is inserted into a filter housing, and the potential for damaging the circuit board during improper assembly is also a concern. These problems are significantly reduced, however, by virtue of the anti-rocking stability provided by the ground strap according to the present invention.

Additionally, Y-axis stretching is not required in order to assemble the ground strap to the circuit board according to the present invention, and Z-axis manufacturing methods can be used, which are preferred. Also, assembling adjacent ground straps onto adjacent circuit boards while the circuit boards remain interconnected by retention tabs in an array is not hindered by the proximity of the ground straps since stretching is not required.

Moreover, since the ground strap according to the present invention can be assembled onto a circuit board that is provided with a pair of circular through-holes, the circuit board array manufacturing efficiency and the circuit board sub-assembly manufacturing efficiency are improved. For example, the round through-holes formed in the circuit board are easily plated by conventional methods, if plating is desired. Furthermore, the round through-holes are more stress-proof than elongate openings and resist deformation when the singulation channels are formed in the circuit board material to define the individual circuit boards of the array. As such, the round through-holes are not subject to the undesirable deformation that is typically experienced when using slotted circuit boards, and the additional slot formation steps or subsequent slot routing steps associated with the prior slotted circuit boards are not required to prevent or correct these problems.

Additionally, the small size and circular shape of the through-holes conserve circuit board surface area instead of consuming it, such that more of the circuit board surface area is available for circuitry pattern formation or for mounting discrete electronic components as compared to slotted or notched circuit boards.

Moreover, in the various embodiments of the present invention which include mechanical engagement means for providing solderless grounding contact, the required electrical contact between the filter housing member, the ground strap and the circuit board is provided and the circuit board is grounded without the need for an additional, manual soldering step. This, in turn, improves production efficiency and reduces costs, as well.

BRIEF DESCRIPTION OF THE DRAWINGS

For a better understanding of the nature and objects of the present invention, reference should be made to the following detailed description of a preferred mode of practicing the invention, read in connection with the accompanying drawings, in which.

DETAILED DESCRIPTION OF THE INVENTION

Figure 13:
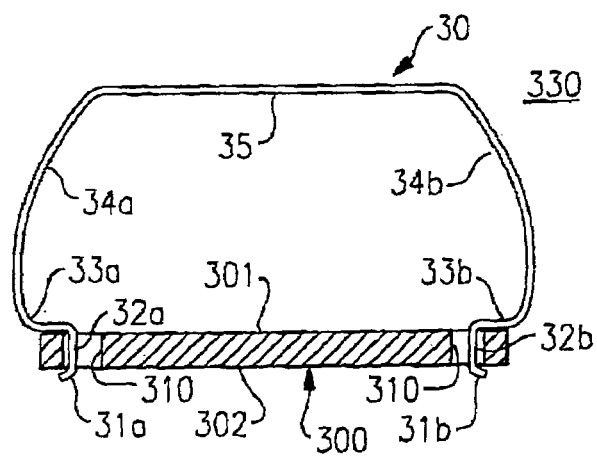
FIG. 13 is a partial cross-sectional end view of a ground strap and circuit board sub-assembly according to one embodiment of the present invention.

In an effort to overcome the drawbacks associated with the ground strap 10 and notched circuit board 100 of FIGS. 1–5 and the ground strap 20 and slotted circuit board 200 of FIGS. 6–12, the ground strap 30 according to the present invention, which is shown, for example, in FIG. 13, was developed. According to one embodiment of the present invention, a circuit board sub-assembly 330 is provided, including a circuit board 300 and a ground strap 30 assembled thereon.

Figure 6:
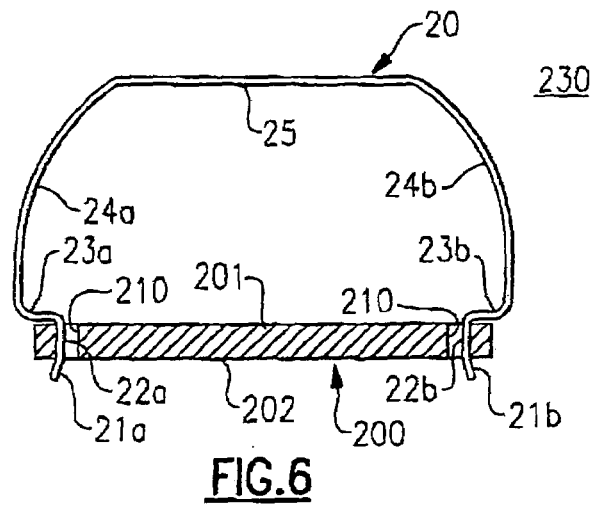
FIG. 6 is a partial cross-sectional end view of another prior art ground strap and circuit board sub-assembly.
Figure 8:
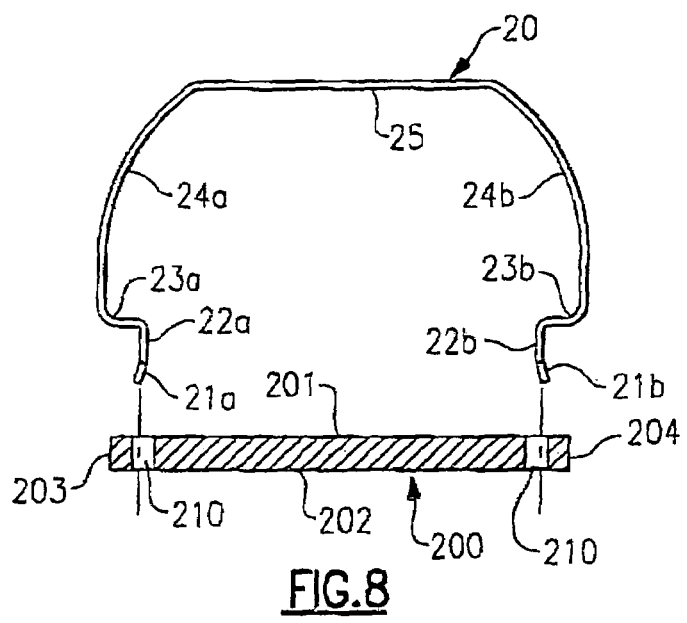
FIG. 8 is a partial cross-sectional assembly view of the ground strap and circuit board shown in FIG. 6.
Figure 9:
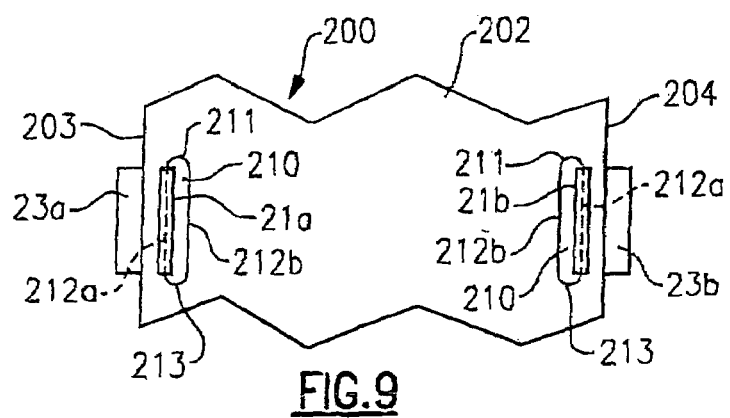
FIG. 9 is a bottom view of the circuit board sub-assembly shown in FIG. 6.
Figure 7:
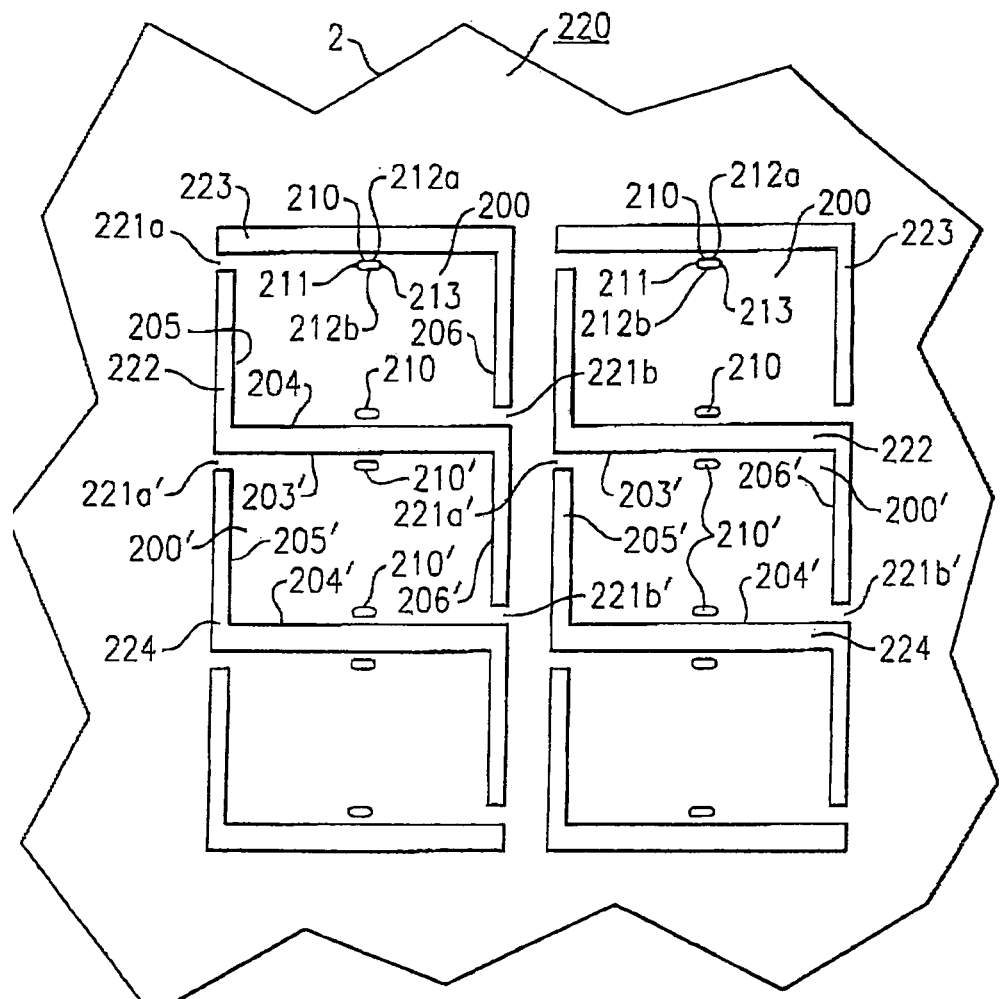
FIG. 7 is a plan view of a prior art slotted circuit board array.
Figure 10:
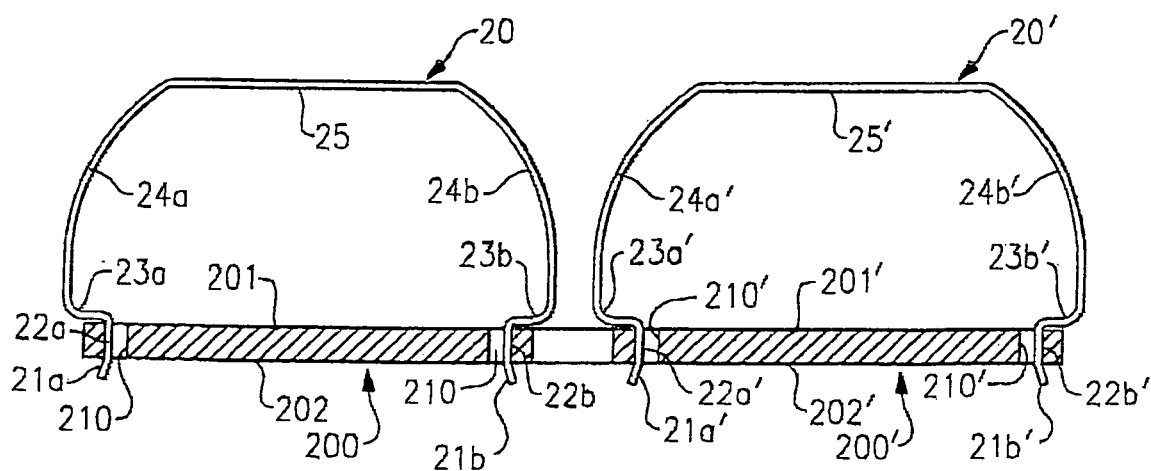
FIG. 10 is a partial cross-sectional end view of a pair of adjacent circuit board sub-assemblies of FIG. 6 prior to singulation from the array.
Figure 11:
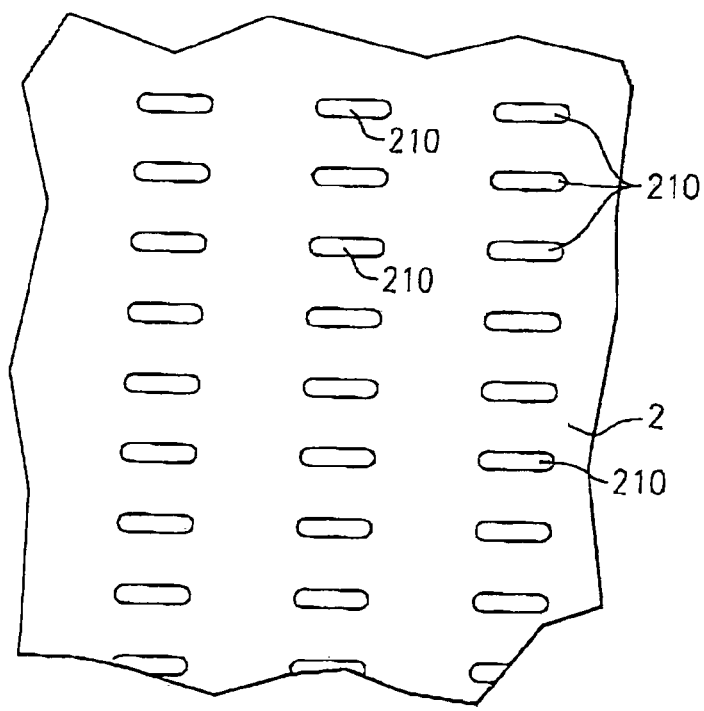
FIG. 11 is a plan view of a circuit board sheet prior to forming the singulation channels shown in FIG. 7.
Figure 12:
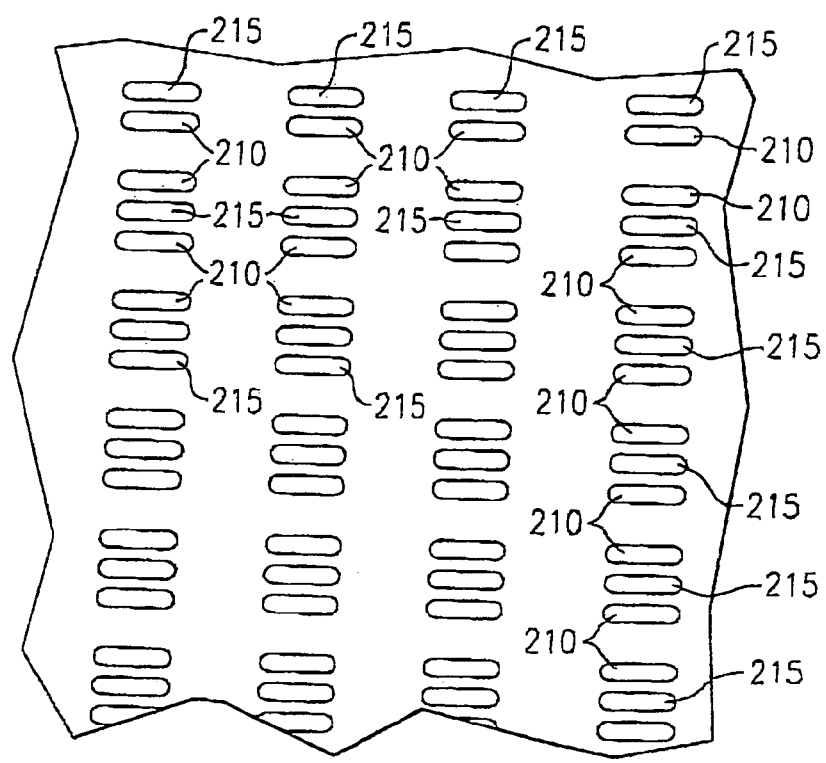
FIG. 12 is a plan view of the circuit board sheet shown in FIG. 11 after forming a second set of peck-drilled slots.

At first glance, it may appear to the untrained eye that when the ground strap 30 is assembled onto the circuit board 300 to form the sub-assembly 330 of FIG. 13, the circuit board sub-assembly 330 looks similar to the circuit board sub-assembly 230 shown in FIG. 6. It should be noted, however, that several important design and efficiency advances are achieved according to the present invention by implementing what might otherwise appear to be incremental changes.

That is, seemingly incremental design and efficiency improvements may, at first glance, appear to entail small-scale changes when viewed in an isolated, direct comparison between the previous design and the incrementally improved version. From a large-scale, automated mass production standpoint, however, it is readily apparent that even seemingly minute design and efficiency improvements directly translate into significant savings with respect to production time, parts and ultimately, production costs.

The ground strap 30 according to present invention is an arched structure including a flattened upper portion 35 interposed between arcuate portions 34a and 34b. As shown, the upper portion 35 of the ground strap 30 is substantially parallel to the plane of the circuit board 300, that is, parallel to both the upper surface 301 and the lower surface 302 of the circuit board 300. The arcuate portions 34a, 34b respectively include a shoulder portion 33a, 33b proximate the respective terminal ends thereof. The shoulder portions 33a, 33b extend inwardly as shown in FIG. 13 in a direction that is substantially parallel to the surfaces 301, 302 of the circuit board 300.

Proximate the shoulder portions 33a, 33b, the ground strap 30 is again bent to form a pair of substantially perpendicular leg portions 32a, 32b that extend from a respective shoulder portion 33a, 33b in a direction (e.g., downward) that is substantially perpendicular to the plane of the circuit board 300. The leg portions 32a, 32b are also bent to form respective foot pads 31a, 31b that extend in a substantially perpendicular direction outwardly (toward the lateral sides 303, 304 of the circuit board 300) from the terminal end of the leg portions 32a, 32b as shown in FIG. 13.

The ground strap 30 can be made from any resilient, conductive material. Examples of suitable materials include, but are not limited to, phosphor bronze and copper alloys, such as beryllium copper and spring tempered brass.

Figure 1:
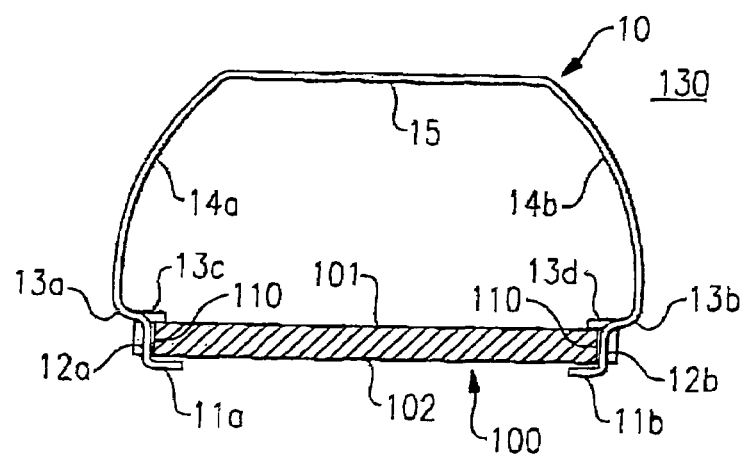
FIG. 1 is a partial cross-sectional end view of a prior art ground strap and circuit board sub-assembly.
Figure 3:
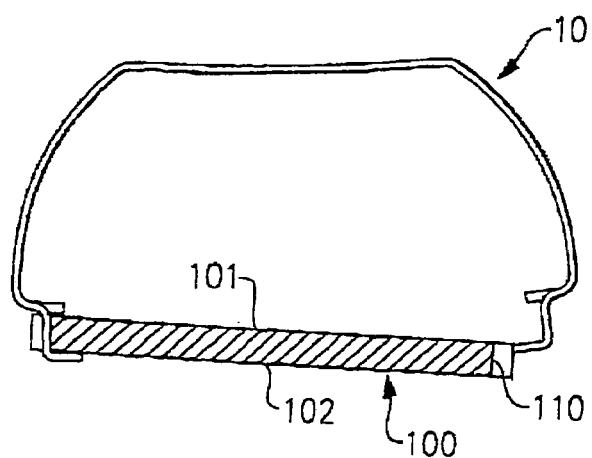
FIG. 3 is a partial cross-sectional assembly view of the ground strap and circuit board shown in FIG. 1.
Figure 4:
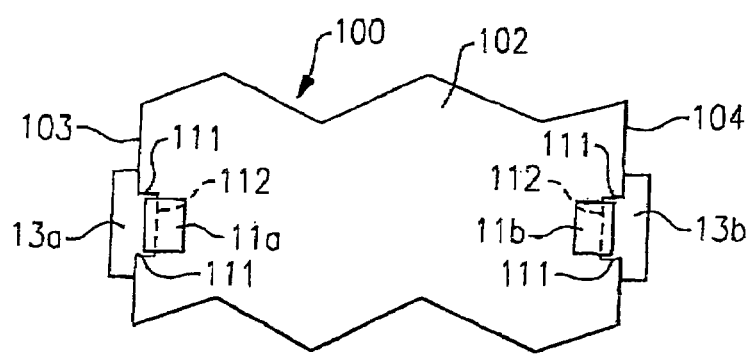
FIG. 4 is a bottom view of the circuit board sub-assembly shown in FIG. 1.
Figure 2:
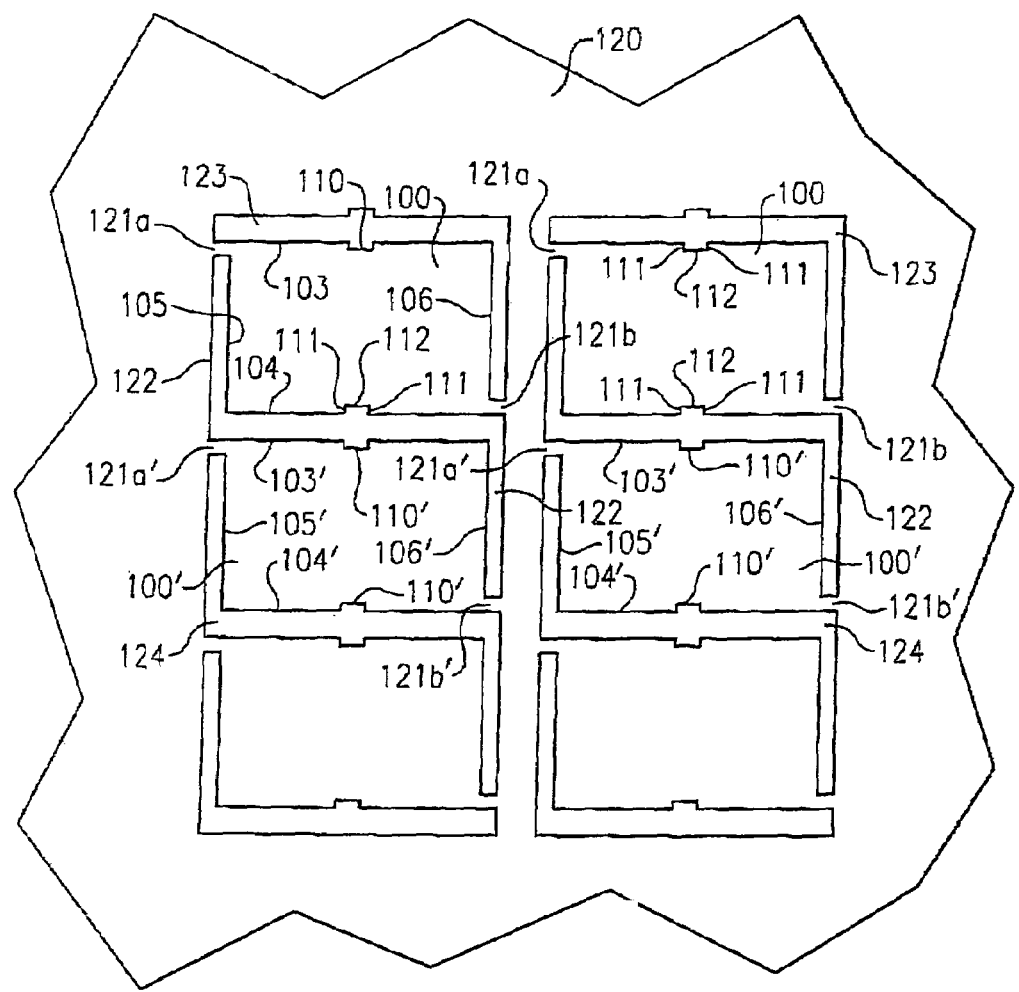
FIG. 2 is a plan view of a prior art notched circuit board array.
Figure 5:
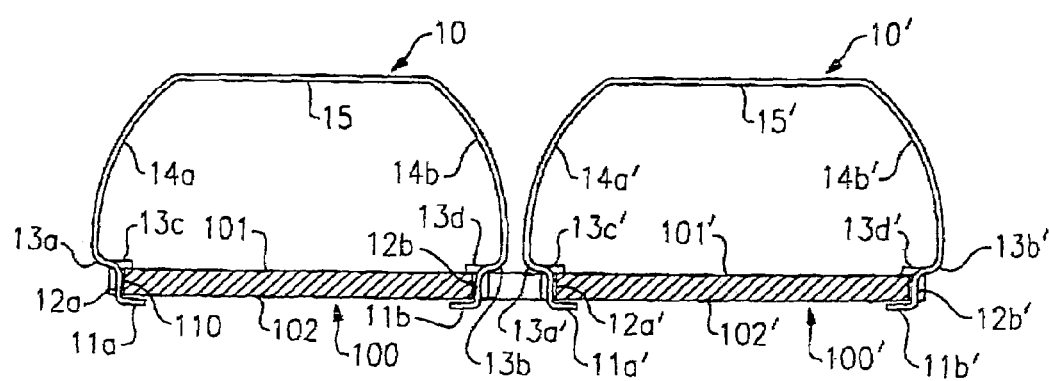
FIG. 5 is a partial cross-sectional end view of a pair of adjacent circuit board sub-assemblies of FIG. 1 prior to singulation from the array.
Figure 14:
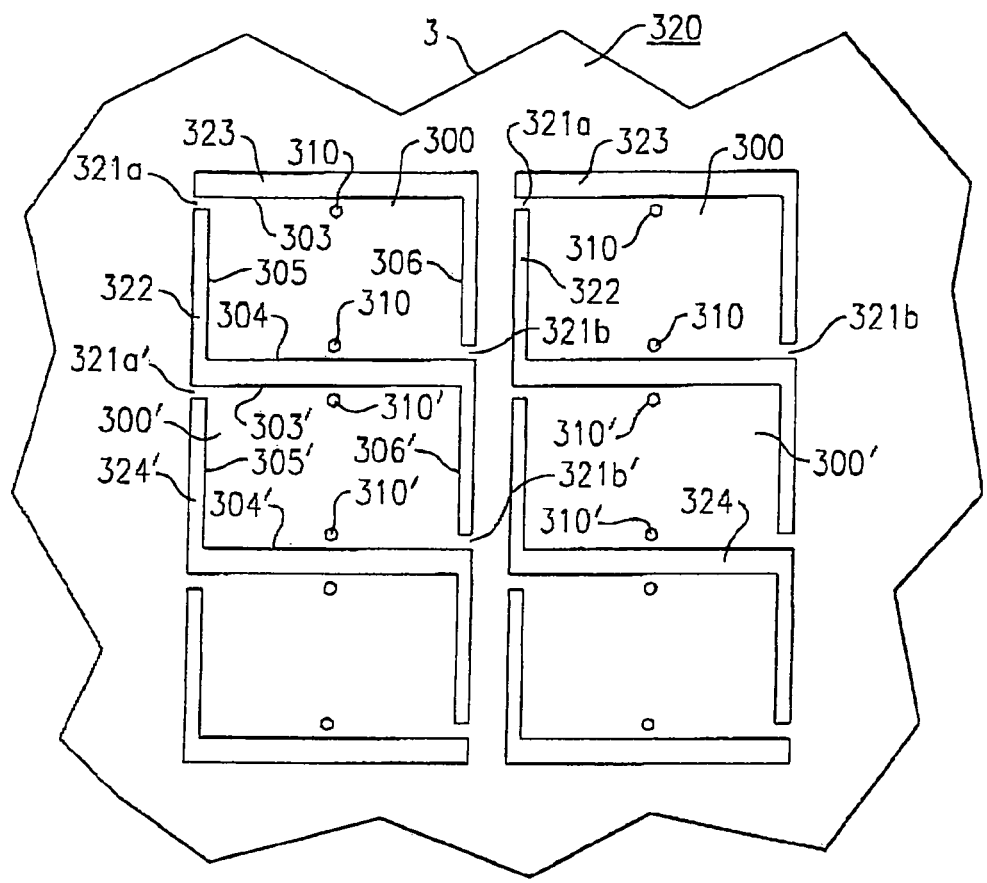
FIG. 14 is a plan view of a circuit board array according to one embodiment of the present invention.

Like the circuit board 100 shown in FIG. 2, the circuit board 300 of FIG. 14 is one of a plurality of initially interconnected circuit boards 300, 300' that are attached via a plurality of retention tabs 321a, 321b (321a', 321b') in an array 320. As shown in FIGS. 13 and 14, for example, each circuit board 300 includes an upper surface 301, a lower surface 302, a first lateral side 303, an opposed second lateral side 304, a first end 305 and an opposed second end 306. While the circuit boards 300 of FIG. 14 remain in the array 320 via the retention tabs 321a, 321b, the first end 305 and the second lateral side 304 of each circuit board 300 are defined by singulation channel 322, and the second end 306 and the first lateral side 303 of each circuit board 300 are defined by another singulation channel 323. The singulation channels 322, 323 are separated from one another by retention tab 321a proximate the intersection point of the first lateral side 303 and the first end 305 of the circuit board 300, and by the retention tab 321b proximate the intersection point between the second lateral side 304 and the second end 306 of the circuit board 300.

In the array 320, as shown in FIG. 14, a circuit board 300' is located immediately adjacent each circuit board 300, sharing a common singulation channel 322. For example, in FIG. 14, circuit board 300' includes a first lateral side 303', an opposed second lateral side 304', a first end 305' and an opposed second end 306'. While the circuit boards 300' remain in the array 320 via the retention tabs 321a', 321b', the first end 305' and the second lateral side 304' are defined by singulation channel 324, and the second end 106' and the first lateral side 303' are defined by the common singulation channel 322 that is shared with the adjacent circuit board 300. Singulation channel 322 is separated from singulation channel 324 by retention tab 321a' proximate the intersection point of the first lateral side 303' and the first end 305' of the circuit board 300', and by retention tab 321b' proximate the intersection point between the second lateral side 304' and the second end 306' of the circuit board 300'.

Unlike the circuit board 100 shown in FIG. 2, however, each circuit board 300, 300' includes a pair of substantially round through-holes 310, (310') formed therein. Each through-hole 310, (310') is, for example, a single drilled hole formed in the proper position in the sheet of circuit board material 3 (See FIG. 14) before the singulation channels 322, 323, 324 etc., are punch formed to define the plurality of circuit boards 300, 300' in the array 320. Since the through-holes 310, (310') are circular and not elongated, only a single drill forming operation is required, rather than the overlapping series of pecks that must be drilled in order to form each slot 210.

The through-holes 310 are roughly 0.048" in diameter and the outer periphery of the through holes are spaced a distance of about 0.030" from the peripheral edges of the first and second lateral sides 303, 304 of the circuit board 300. Through-holes 310' are substantially identical for the circuit board 300'. As shown in FIG. 14, the through-holes 310, 310' are positioned substantially at the mid-point along the length of the first and second lateral sides 303, 304 (303', 304') of the circuit boards 300, 300', and the distance between the center points of the through-hole pairs on each circuit board is about 0.528". Although it is not shown in the drawings, a plurality of through-hole pairs can be formed in the circuit board material 3 for each circuit board of the array 320, and a plurality of ground straps 30 can be provided for each circuit board.

Compared to the notches 110 and the slots 210 of the prior art circuit boards 100 and 200, the circular through-holes 310 according to the circuit board 300 of the present invention do not consume a large amount of circuit board surface area, and it is possible to provide additional circuitry or discrete electronic components on the lower surface 302 of the circuit board 300 in close proximity to the through-holes 310. Such additional circuitry and/or components could not be provided in the notched or slotted circuit boards described above since the circuit board material is removed when the notches or slots are formed, and thus, is not available. Additionally, the round, drilled through-holes 310 are easily plated by conventional methods, if plating is desired. It should be noted, however, that although it is preferred to plate the through-holes 310 with a conductive material to ensure the desired electrical communication between the circuit board 300 and the ground strap 30, such plating is not required in all instances. That is, the desired electrical communication between the circuit board 300 and the ground strap 30 can also be provided by virtue of the solder that is introduced into the through-holes when the array 320 is wave soldered and which secures the ground strap 30 to the circuit board 300.

Figure 15:
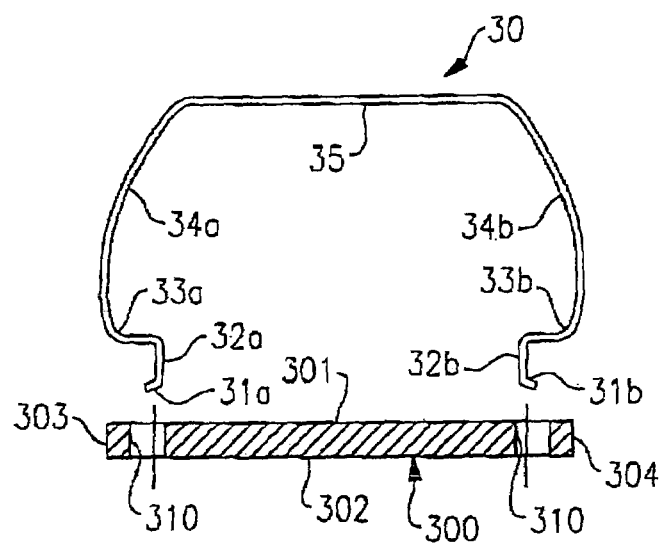
FIG. 15 is a partial cross-sectional assembly view of the ground strap and circuit board shown in FIG. 13.

A plurality of ground straps 30 are attached to the plurality of circuit boards 300 of the array 320 in the manner shown in FIG. 15. Using only Z-directional-axis manufacturing techniques, the arcuate portions 34a, 34b of the ground strap 30 are slightly compressed, for example, by a slight pincer motion of a Z-axis type robotic arm, and the foot pads 31a, 31b are downwardly inserted into the through-holes 310 until the foot pads 31a, 31b are angled under the lower surface 302 of the circuit board 300. When the compressive force is released, the leg portions 32a, 32b expand outwardly and contact a peripheral surface portion of the through-holes 330, as shown in FIG. 13.

Figure 16:
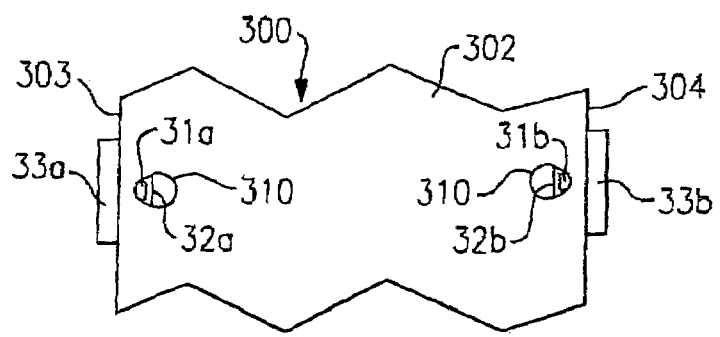
FIG. 16 is a bottom view of the circuit board sub-assembly shown in FIG. 13.

As shown in FIG. 16, the respective leg portions 32a, 32b and the respective foot pads 31a, 31b have a width that is less than the width of the respective arcuate portions 34a, 34b and less than the width of the respective shoulder portions 33a, 33b so that the leg portions 32a, 32b and the foot pads 31a, 31b pass through the through-hole 310. At least a portion of the leg portions 32a, 32b resides within the through-hole 310 and contacts a portion of the peripheral surface of the through-hole 310. The foot pads 31a, 31b effectively engage the lower surface 302 of the circuit board 300 and extend a distance from the outer periphery of the through-holes 330 toward a respective one of the first and second lateral side 303, 304 of the circuit board 300, which is also shown in FIG. 16.

The ground strap 30 according to the present invention overcomes the drawbacks associated with the prior art ground straps described above in a variety of ways. First, the shoulder portions 33a, 33b and the foot pads 31a, 31b essentially sandwich the circuit board 300 and provide Z-axis anti-rocking stability. This anti-rocking stability is increased by the force exerted on the through-holes 310 by the leg portions 32a, 32b which provides improved stability when the array 320 is wave soldered, as each circuit board sub-assembly 330 is singulated from the array 320 and as each circuit board sub-assembly is inserted into an electronic device, such as a CATV filter housing member.

Figure 17:
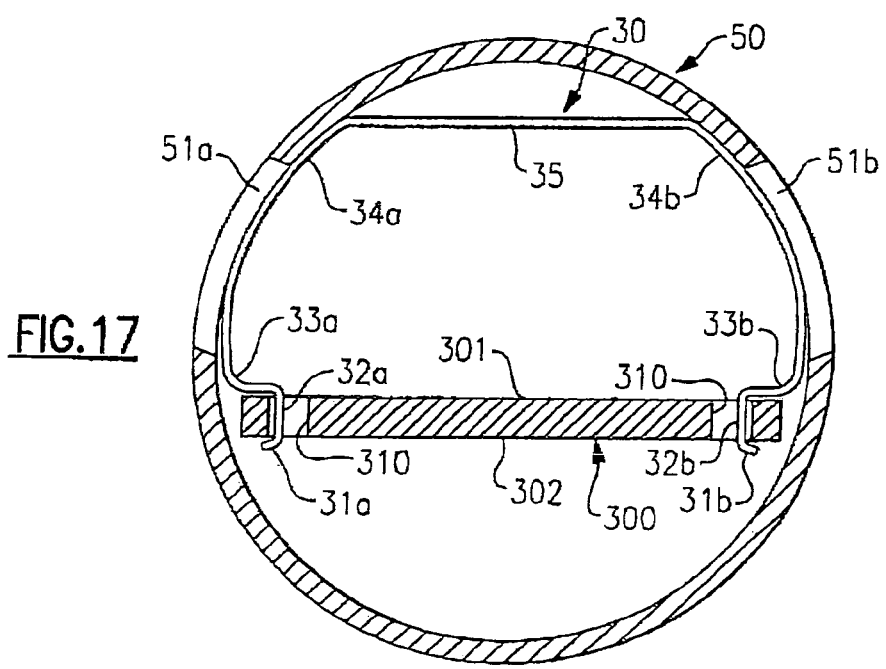
FIG. 17 is a partial cross-sectional end-view of the circuit board sub-assembly of FIG. 13 inserted into a filter housing member.

Preventing the ground straps 30 from rocking on the circuit boards 300 during wave soldering is important, for example, because it is desirable for the axis of the ground strap 30 to remain perpendicular to the circuit board both during wave soldering, and subsequently, when the circuit board sub-assembly is inserted into a filter housing 50, as shown in FIG. 17. As the circuit board sub-assembly 330 according to the present invention is inserted into the filter housing member 50, a certain clearance is provided so that the outer surfaces of the arcuate portions 34a, 34b do not actually contact the inner peripheral surface of the filter housing 50. A pair of solder slots 51a, 51b are provided in the filter housing member 50 such that a portion of the outer surfaces of the arcuate portions 34a, 34b of the ground strap 30 are exposed. Solder is filled into the solder slots 51a, 51b to secure the electrical connection between the filter housing 50, the ground strap 30 and the circuit board 300.

Any deviation from the desired positional relationship, however, is likely to result in ground strap misalignment during insertion. Such misfits can disrupt or interfere with providing the proper clearance between the first portion of the ground strap and the inner surface of the filter housing for subsequent soldering that is sufficient to provide the intended electrical communication between the circuit board, the ground strap and the filter housing. Also, the structural integrity of the ground strap 30 can be damaged if a misaligned sub-assembly 330 is inserted into a filter housing 50, and the potential for damaging the circuit board during improper assembly is also a concern. These problems are significantly reduced, however, by virtue of the anti-rocking stability provided by the ground strap 30.

It should be noted, however, that although preventing ground strap misalignment and misfits during insertion into a filter housing is desirable, some embodiments of the present invention do not require the clearance that is provided between the ground strap 30 and the inner surface of the filter housing 50, as described above with respect to FIG. 17. For example, FIG. 18 shows a partial cross-sectional end-view of an electronic signal filter including a circuit board sub-assembly having a ground strap with one example mechanical engagement means for providing solderless grounding contact according to another embodiment of the present invention.

Figure 18:
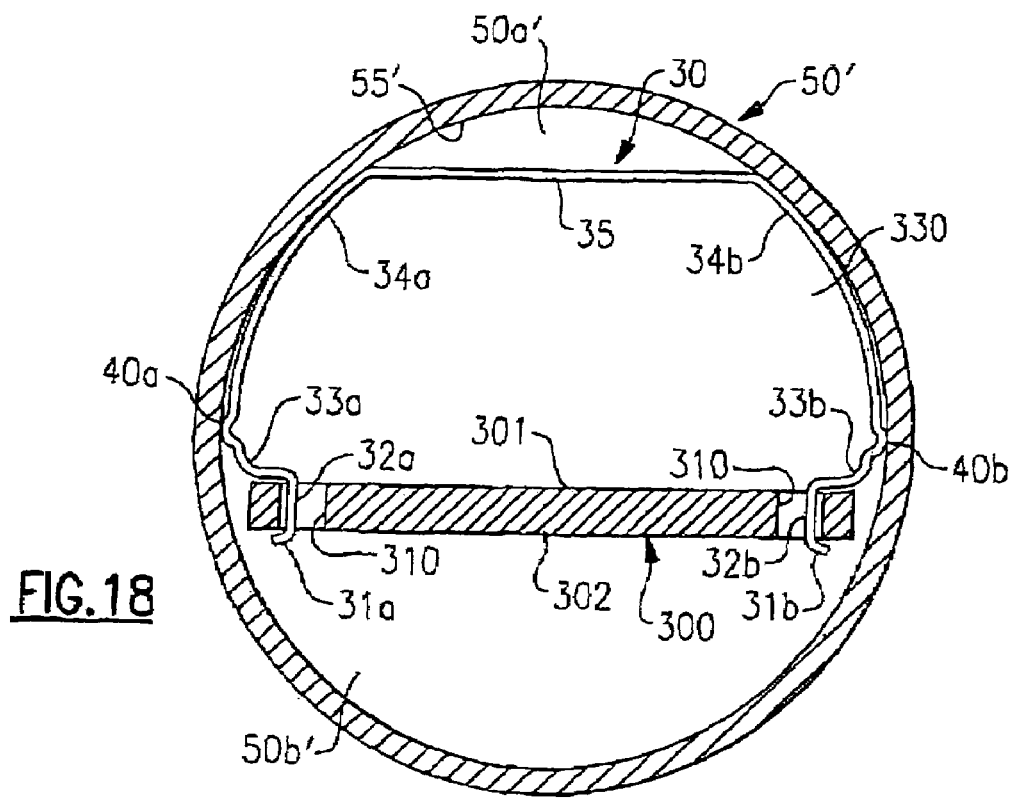
FIG. 18 is a partial cross-sectional end-view of an electronic signal filter including a circuit board sub-assembly having a ground strap with one example mechanical engagement means for providing solderless grounding contact according to another embodiment of the present invention.

As shown in FIG. 18, the circuit board sub-assembly 330 is inserted into a filter housing 50', and the outer surface of the arcuate portions 34a, 34b of the ground strap 30 contact the inner peripheral surface 55' of the first compartment 50a' of the filter housing 50'. Mechanical engagement means for providing solderless grounding contact 40a, 40b are respectively provided on the arcuate portions 33a, 33b of the ground strap 30 proximate the shoulder portions 32a, 32b. In FIG. 18, the mechanical engagement means 40a, 40b are shown as substantially spherical protrusions or bumps that protrude outwardly from the arcuate portions 34a, 34b of the ground strap 30 toward the inner peripheral surface 55"of the first compartment 50a' of the housing 50'. The mechanical engagement means 40a, 40b contact and engage (e.g., interfere with the surface integrity of) the inner peripheral surface 55' of the first compartment 50a' of the filter housing 50' to provide a secure physical and electrical connection between the ground strap 30 and the housing 50'. In that manner, the additional soldering step described above with respect to FIG. 17 is eliminated and the production efficiency can be further improved.

Figure 19:
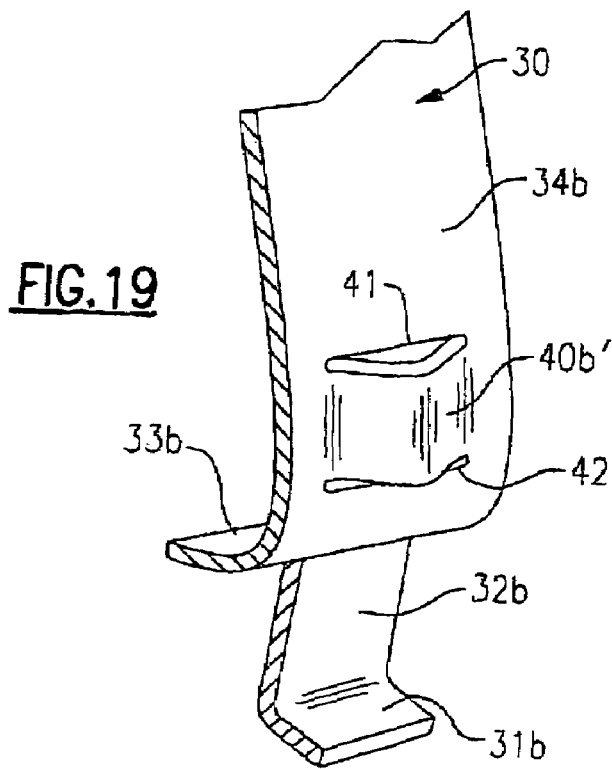
FIG. 19 is a partial perspective view of a ground strap with another example mechanical engagement means for providing solderless grounding contact according to another embodiment of the present invention.

FIG. 19 is a partial perspective view of another ground strap with another example mechanical engagement means for providing solderless grounding contact according to the present invention. As shown, the ground strap includes mechanical engagement means for providing solderless grounding contact 40b' on the arcuate portion 33b proximate the shoulder portion 32b. Although it is not shown in FIG. 19, it should be readily understood that the other half of the ground strap would also include the same structure (i.e., mechanical engagement means 40a') in a corresponding position.

The mechanical engagement means 40b' of FIG. 19 includes a pair of slots 41, 42 that pass through the thickness of the arcuate portion 33b and that traverse the width, but not the entire width, of the arcuate portion 33b. The ground strap material between the slots 41, 42 is stretched outwardly to protrude a distance from the arcuate portion 33b as the mechanical engagement means 40b'. When the ground strap shown in FIG. 19 is inserted into a filter housing 50', as shown in FIG. 18, the mechanical engagement means 40b' contacts and engages (e.g., interferes with the surface integrity of) the inner peripheral surface 55' of the first compartment 50a' of the filter housing 50' to provide a secure physical and electrical connection between the ground strap and the housing 50'.

It should be noted that although the exact shape of the mechanical engagement means is not limited to those shapes particularly described above with reference to FIGS. 18 and 19, each of the aforementioned shapes enables non-oriented assembly of the ground straps onto the circuit boards when the circuit board sub-assembly is formed. That is, other shapes which also enable non-oriented assembly of the ground straps onto the circuit boards are also suitable, and modifications to the exact shape can be made without departing from the scope and spirit of the present invention.

In each of the embodiments of the present invention, Y-axis stretching is not required in order to assemble the ground straps 30 to the circuit boards 300 on the array 320, and complete assembly can be provided merely by Z-axis manufacturing methods, which are preferred. Assembling subsequent, sequential ground straps 30 onto adjacent circuit boards 300 while the circuit boards remain interconnected by the retention tabs 321a, 321b in the array 320 is not hindered by the proximity of the circuit boards and the ground straps since Y-axis stretching is not required.

Moreover, since the ground straps 30 according to the present invention can be assembled onto a circuit board provided with a pair of circular through-holes, the circuit board and circuit board sub-assembly manufacturing efficiency is improved. That is, the round through-holes 310 are more stress-proof than the aforementioned slots and resist deformation when the singulation channels 322, 323 are formed in the circuit board material 3 to define the individual circuit boards 300 of the array 320. As such, the round through-holes 310 are not subject to the undesirable deformation that is typically experienced when using slotted circuit boards (such as the slotted circuit board 200), and additional peck-drilled slots or subsequent routing steps are not required to prevent or correct this problem.

Further, the outer surfaces of the leg portions 322a, 322b of the ground strap 30 according to the present invention are positioned within the through-holes 310, and are not directly exposed to solder when the array 320 is wave soldered. Thus, the aforementioned wicking problem is not encountered.

Additionally, the size and shape of the through-holes 310 conserve circuit board surface area instead of consuming it, such that more circuit board area is available for circuitry or discrete component mounting, at least on the second surface 302 of the circuit board 300, compared to slotted or notched circuit boards.

Moreover, in the various embodiments of the present invention that include mechanical engagement means for providing solderless grounding contact, the required electrical contact between the filter housing member, the ground strap and the circuit board is provided and the circuit board is grounded without the need for an additional, manual soldering step. This, in turn, improves production efficiency and reduces costs, as well.

While the present invention has been particularly shown and described with reference to the preferred mode as illustrated in the drawings, it will be understood by one skilled in the art that various changes in detail may be effected therein without departing from the spirit and scope of the invention as defined by the claims.

What is claimed is:

1. An electronic signal filter comprising:
   a cylindrical housing adapted to be electrically grounded and having a first end, an opposed second end and an inner peripheral surface defining an interior compartment;
   a circuit board positioned within said interior compartment of said cylindrical housing, said circuit board having a first surface and an opposed second surface, said circuit board substantially dividing said interior compartment into a first compartment defined by said first surface of said circuit board and a first portion of said inner peripheral surface of said cylindrical housing, and a second compartment defined by said second surface of said circuit board and a second portion of said inner peripheral surface of said cylindrical housing, said circuit board further having a plurality of peripheral edges and at least two circular through-holes formed therein, each said through-hole being inwardly spaced from one of said peripheral edges of said circuit board, defining a first distance between an outer peripheral portion of a respective one of said through-holes and a respective peripheral edge of said circuit board and defining a second distance between respective centers of said through-holes; and
   a ground strap attached to and spaced a distance above said circuit board, said ground strap having a first portion extending from said first surface of said circuit board and spanning a portion of said circuit board over at least said second distance, an integral second portion residing in and extending through each said through-hole, and an integral third portion immediately adjacent said second portion, said third portion contacting a portion of said second surface of said circuit board;
   wherein at least a portion of said first portion of said ground strap contacts a portion of said inner peripheral surface of said cylindrical housing to ground said circuit board.

2. The electronic signal filter of claim 1, wherein said through-holes are plated with a conductive material.

3. The electronic signal filter of claim 1, wherein said first distance is about 0.030 inch, and wherein said second distance is about 0.528 inch.

4. The electronic signal filter of claim 1, wherein a diameter of said through-hole is about 0.048 inch.

5. The electronic signal filter of claim 1, wherein said third portion of said ground strap contacts a portion of said second surface of said circuit board in a portion of said first distance.

6. The electronic signal filter of claim 1, wherein said first portion of said ground strap comprises:
   a pair of arcuate portions extending from said first surface of said circuit board in a first direction away from said first surface of said circuit board, said arcuate portions being joined by a flat portion extending between a respective first end of each said arcuate portion in a second direction substantially parallel to said plane of said first surface of said circuit board; and
   a pair of shoulder portions extending from a respective first end thereof integral with a respective second end of each said arcuate portion substantially in said second direction such that a portion of each said shoulder portion contacts said first surface of said circuit board in a portion of said first distance.

7. The electronic signal filter of claim 5, wherein said second portion of said ground strap comprises a pair of leg portions extending from a first end thereof integral with a respective second end of each said shoulder portion, and extending through said through-holes in a third direction substantially perpendicular to said plane of said first surface of said circuit board and opposing said first direction.

8. The electronic signal filter of claim 6, wherein a width of each said leg portion is less than a width of at least one of said arcuate portion and said shoulder portion such that said leg portions fit within and contact at least a portion of an inner surface of said through-holes.

9. The electronic signal filter of claim 6, wherein said third portion of said ground strap comprises a pair of foot pads extending from a first end thereof integral with a respective second end of each said leg portion in said second direction toward a respective peripheral edge of said circuit board such that a portion of each said foot portion contacts a portion of said second surface of said circuit board in a portion of said first distance.

10. A method for manufacturing a circuit board sub-assembly, comprising the steps of:
providing a sheet of circuit board material having a first surface and an opposed second surface;
forming a plurality of circular through-holes in said sheet;
forming a plurality of singulation channels in said sheet, said singulation channels defining a plurality of retention tabs that separate said singulation channels from one another, and defining a plurality of peripheral edges defining an array of circuit boards, each said circuit board having a first surface and an opposed second surface and including at least two of said through-holes, said at least two through-holes being positioned proximate and spaced a first distance from opposed peripheral edges of said circuit board and being spaced a second distance from one another;
providing a plurality of ground straps having a first portion, an integral second portion, and a third portion immediately adjacent said second portion;
positioning said ground straps on said circuit boards of said array, such that said first portion extends a distance above said first surface of said circuit board and spans said circuit board over said second distance, said second portion extends into and resides within said through-holes, and said third portion contacts a portion of said second surface of said circuit board;
wave soldering said array to respectively secure said ground straps to said circuit boards; and
singulating each said circuit board from said array to provide an individual circuit board sub-assembly.

11. The method of claim 10, further comprising a step of plating said through-holes with a conductive material before said singulation channels are formed.

12. A circuit board sub-assembly, comprising:
a circuit board having a first surface, an opposed second surface, a plurality of peripheral edges and at least two circular through-holes formed therein, each said through-hole being inwardly spaced from one of said peripheral edges of said circuit board, defining a first distance between an outer peripheral portion of a respective one of said through-holes and a respective peripheral edge of said circuit board and defining a second distance between respective centers of said through-holes; and a ground strap attached to said circuit board, said ground strap having a first portion extending a distance above said first surface of said circuit board and spanning a portion of said circuit board over at least said second distance, an integral second portion residing in and extending through each said through-hole, and an integral third portion immediately adjacent said second portion, said third portion contacting a portion of said second surface of said circuit board.

13. The circuit board sub-assembly of claim 12, wherein said through-holes are plated with a conductive material.

14. The circuit board sub-assembly of claim 12, wherein said first distance is about 0.030 inch, and wherein said second distance is 0.528 inch.

15. The circuit board sub-assembly of claim 12, wherein a diameter of said through-hole is about 0.048 inch.

16. The circuit board sub-assembly of claim 12, wherein said third portion of said ground strap contacts a portion of said second surface of said circuit board in a portion of said first distance.

17. The circuit board sub-assembly of claim 12, wherein said first portion of said ground strap comprises:
a pair of arcuate portions extending above said first surface of said circuit board in a first direction away from said first surface of said circuit board, said arcuate portions being joined by a flat portion extending between a respective first end of each said arcuate portion in a second direction substantially parallel to said plane of said first surface of said circuit board; and
a pair of shoulder portions extending from a respective first end thereof integral with a respective second end of each said arcuate portion substantially in said second direction such that a portion of each said shoulder portion contacts said first surface of said circuit board in a portion of said first distance.

18. The circuit board sub-assembly of claim 17, wherein said first portion of said ground strap further comprises mechanical engagement means for providing solderless grounding contact positioned on a portion of each said arcuate portion proximate a respective one of said shoulder portions.

19. The circuit board sub-assembly of claim 18, wherein each said mechanical engagement means for providing solderless grounding contact comprises a protrusion extending outwardly away from said arcuate portions.

20. The circuit board sub-assembly of claim 17, wherein said second portion of said ground strap comprises a pair of leg portions extending from a first end thereof integral with a respective second end of each said shoulder portion, and extending through said through-holes in a third direction substantially perpendicular to said plane of said first surface of said circuit board and opposing said first direction.

21. The circuit board sub-assembly of claim 20, wherein a width of each said leg portion is less than a width of at least one of said arcuate portion and said shoulder portion such that said leg portions fit within and contact at least a portion of an inner surface of said through-holes.

22. The circuit board sub-assembly of claim 20, wherein said third portion of said ground strap comprises a pair of foot pads extending from a first end thereof integral with a respective second end of each said leg portion in said first direction toward a respective peripheral edge of said circuit board such that a portion of each said foot portion contacts a portion of said second surface of said circuit board in a portion of said first distance.

23. A method for manufacturing a CATV filter, comprising the steps of:
 providing a circuit board sub-assembly by a method comprising the steps of
  providing a sheet of circuit board material having a first surface and an opposed second surface,
  forming a plurality of circular through-holes in said sheet,
  forming a plurality of singulation channels in said sheet, said singulation channels defining a plurality of retention tabs that separate said singulation channels from one another, and defining a plurality of peripheral edges defining an array of circuit boards, each said circuit board having a first surface and an opposed second surface and including at least two of said through-holes, said at least two through-holes being positioned proximate and spaced a first distance from opposed peripheral edges of said circuit board and being spaced a second distance from one another,
  providing a plurality of ground straps having a first portion, an integral second portion, and a third portion immediately adjacent said second portion,
  positioning said ground straps on said circuit boards of said array, such that said first portion extends a distance above said first surface of said circuit board and spans said circuit board over said second distance, said second portion extends into and resides within said through-holes, and said third portion contacts a portion of said second surface of said circuit board,
  wave soldering said array to respectively secure said ground straps to said circuit boards, and
  singulating each said circuit board from said array to provide an individual circuit board sub-assembly;
 providing a cylindrical filter housing adapted to be electrically grounded and having a first end, an opposed second end, an outer surface, an inner peripheral surface defining an interior compartment and at least one opening communicating between said outer surface and said interior compartment;
 positioning said circuit board-sub assembly within said interior compartment of said cylindrical housing such that said circuit board substantially divides said interior compartment into a first compartment defined by said first surface of said circuit board and a first portion of said inner peripheral surface of said cylindrical housing, and a second compartment defined by said second surface of said circuit board and a second portion of said inner peripheral surface of said cylindrical housing, wherein said first portion of said ground strap is located within said first compartment, wherein said at least one opening communicates between said outer surface of said filter housing and said first compartment, and wherein a portion of said first portion of said ground strap is exposed to the outside environment via said opening; and
 grounding said circuit board by applying solder to said opening of said filter housing such that said solder is in intimate contact with a portion of said first portion of said ground strap and with at least a portion of said inner peripheral surface of said cylindrical housing.

24. The method of claim 23, wherein said through-holes are plated with a conductive material before said singulation channels are formed during said method of providing said circuit boards sub-assembly.

25. A circuit board sub-assembly, comprising:
 a circuit board having a first surface, an opposed second surface, a plurality of peripheral edges and at least two circular through-holes formed therein, each said through-hole being inwardly spaced from one of said peripheral edges of said circuit board, defining a first distance between an outer peripheral portion of a respective one of said through-holes and a respective peripheral edge of said circuit board and defining a second distance between respective centers of said through-holes; and
 a ground strap attached to said circuit board, said ground strap comprising
  a first portion extending a distance above said first surface of said circuit board and spanning a portion of said circuit board over at least said second distance, said first portion comprising
   a pair of arcuate portions extending above said first surface of said circuit board in a first direction away from said first surface of said circuit board, said arcuate portions being joined by a flat portion extending between a respective first end of each said arcuate portion in a second direction substantially parallel to said plane of said first surface of said circuit board,
   a pair of shoulder portions extending from a respective first end thereof integral with a respective second end of each said arcuate portion substantially in said second direction such that a portion of each said shoulder portion contacts said first surface of said circuit board in a portion of said first distance, and
   mechanical engagement means for providing solderless grounding contact positioned on a portion of each said arcuate portion proximate a respective one of said shoulder portions,
  an integral second portion residing in and extending through each said through-hole, said second portion comprising a pair of leg portions extending from a first end thereof integral with a respective second end of each said shoulder portion, and extending through said through-holes in a third direction substantially perpendicular to said plane of said first surface of said circuit board and opposing said first direction, and
  an integral third portion immediately adjacent said second portion, said third portion comprising a pair of foot pads extending from a first end thereof integral with a respective second end of each said leg portion in said first direction toward a respective peripheral edge of said circuit board such that a portion of each said foot portion contacts a portion of said second surface of said circuit board in a portion of said first distance, wherein said third portion contacts a portion of said second surface of said circuit board.

26. The circuit board sub-assembly of 25, wherein each said mechanical engagement means comprises a protrusion extending outwardly away from said arcuate portions.

27. The circuit board sub-assembly of 25, wherein said through-holes are plated with a conductive material.

28. A method for manufacturing a CATV filter, comprising the steps of:
 providing a circuit board sub-assembly by a method comprising the steps of
  providing a sheet of circuit board material having a first surface and an opposed second surface, forming a plurality of circular through-holes in said sheet, forming a plurality of singulation channels in said sheet, said singulation channels defining a plurality of retention tabs that separate said singulation channels from one another, and defining a plurality of peripheral edges defining an array of circuit boards, each said circuit board having a first surface and an opposed second surface and including at least two of said through-holes, said at least two through-holes being positioned proximate and spaced a first distance from opposed peripheral edges of said circuit board and being spaced a second distance from one another, providing a plurality of ground straps having a first portion including mechanical engagement means for providing solderless grounding contact, an integral second portion, and a third portion immediately adjacent said second portion, positioning said ground straps on said circuit boards of said array such that said first portion extends a distance above said first surface of said circuit board and spans said circuit board over said second distance, said second portion extends into and resides within said through-holes, and said third portion contacts a portion of said second surface of said circuit board, wave soldering said array to respectively secure said ground straps to said circuit boards, and singulating each said circuit board from said array to provide an individual circuit board sub-assembly;

providing a cylindrical filter housing adapted to be electrically grounded and having a first end, an opposed second end, an outer surface, and an inner peripheral surface defining an interior compartment; and positioning said circuit board-sub assembly within said interior compartment of said cylindrical housing such that said circuit board substantially divides said interior compartment into a first compartment defined by said first surface of said circuit board and a first portion of said inner peripheral surface of said cylindrical housing and a second compartment defined by said second surface of said circuit board and a second portion of said inner peripheral surface of said cylindrical housing, wherein said first portion of said ground strap is located within said first compartment, and wherein said mechanical engagement means contacts and engages a portion of said inner peripheral surface of said first compartment to provide ground contact between said filter housing member and said circuit board without soldering.

* * * * *